United States Patent
Li et al.

(10) Patent No.: US 9,136,117 B2
(45) Date of Patent: *Sep. 15, 2015

(54) METHOD FOR MAKING SEMICONDUCTING SINGLE WALL CARBON NANOTUBES

(71) Applicants: Tsinghua University, Beijing (CN); HON HAI PRECISION INDUSTRY CO., LTD., New Taipei (TW)

(72) Inventors: Jie Li, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 15 days.

This patent is subject to a terminal disclaimer.

(21) Appl. No.: 13/798,802

(22) Filed: Mar. 13, 2013

(65) Prior Publication Data

US 2013/0252405 A1    Sep. 26, 2013

(30) Foreign Application Priority Data

Mar. 21, 2012 (CN) .......................... 2012 1 0075757

(51) Int. Cl.
*H01L 21/20* (2006.01)
*H01L 21/02* (2006.01)
*H01L 51/00* (2006.01)
*C01B 31/02* (2006.01)
*B82Y 40/00* (2011.01)

(52) U.S. Cl.
CPC ...... *H01L 21/02606* (2013.01); *C01B 31/0226* (2013.01); *H01L 51/00* (2013.01); *B82Y 40/00* (2013.01); *C01B 2202/02* (2013.01); *Y10S 977/845* (2013.01); *Y10S 977/932* (2013.01)

(58) Field of Classification Search
CPC .................... H01L 21/02606; H01L 21/0271; H01L 21/0331
USPC .................................. 438/478, 795; 977/845
See application file for complete search history.

(56) References Cited

U.S. PATENT DOCUMENTS 7,947,145 B2    5/2011    Wang et al.
2009/0252946 A1    10/2009    Marsh et al.
(Continued)

FOREIGN PATENT DOCUMENTS

| CN | 101462391 | 6/2009 |
| TW | 200628398 | 8/2006 |
| TW | 201137002 | 11/2011 |

OTHER PUBLICATIONS

Philip G. Collins et al. Science 292,706(2001).

*Primary Examiner* — Bradley K Smith
(74) *Attorney, Agent, or Firm* — Novak Druce Connolly Bove + Quigg LLP

(57) ABSTRACT

A method for making semiconducting single walled carbon nanotubes (SWCNTs) includes providing a substrate. A single walled carbon nanotube film including metallic SWCNTs and semiconducting SWCNTs is located on the substrate. At least one electrode is located on the single walled carbon nanotube film and electrically connected with the single walled carbon nanotube film. A macromolecule material layer is located on the single walled carbon nanotube film to cover the single walled carbon nanotube film. The macromolecule material layer covering the metallic SWCNTs is removed by an electron beam bombardment method, to expose the metallic SWCNTs. The metallic SWCNTs and the macromolecule material layer covering the semiconducting SWCNTs are removed.

20 Claims, 5 Drawing Sheets

(56) References Cited

U.S. PATENT DOCUMENTS

2010/0166624 A1* 7/2010 Raston et al. .............. 423/1
2012/0251396 A1* 10/2012 Lee .............................. 422/119
2013/0251618 A1* 9/2013 Li et al. ...................... 423/447.1

* cited by examiner

METHOD FOR MAKING SEMICONDUCTING SINGLE WALL CARBON NANOTUBES

RELATED APPLICATIONS

This application claims all benefits accruing under 35 U.S.C. §119 from China Patent Application No. 201210075757.8, filed on Mar. 21, 2012 in the China Intellectual Property Office. This application is related to commonly-assigned application Ser. No. 13/798,789 entitled "METHOD FOR MAKING SEMICONDUCTING CARBON NANOTUBES," concurrently filed. Disclosures of the above-identified applications are incorporated herein by reference.

BACKGROUND

1. Technical Field

The present application relates to a method for making semiconducting single walled carbon nanotubes.

2. Discussion of Related Art

Single walled carbon nanotubes (SWCNTs) may be metallic or semiconducting, and may have varying diameters and lengths. Applications using SWCNTs may be improved if SWCNTs of uniform conductivity, such as all semiconducting SWCNTs or all metallic SWCNTs, are provided. Accordingly, a method for making semiconducting SWCNTs is desired.

A method for making semiconducting SWCNTs involves destruction of metallic SWCNTs by electric current (See, Collin P. et al., Science, 2001, 292, 706). A principle of this method is that semiconducting SWCNTs can be turn "off" by applying a gate voltage. It is possible to burn out metallic SWCNTs by application of a high source-drain voltage in the presence of oxygen. However, when a current flows through the metallic SWCNTs, Joule heat generated by the metallic SWCNTs might inadvertently burn out the adjacent semiconducting SWCNTs.

What is needed, therefore, is to provide a method for making semiconducting SWCNTs that can overcome the above-described shortcomings

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
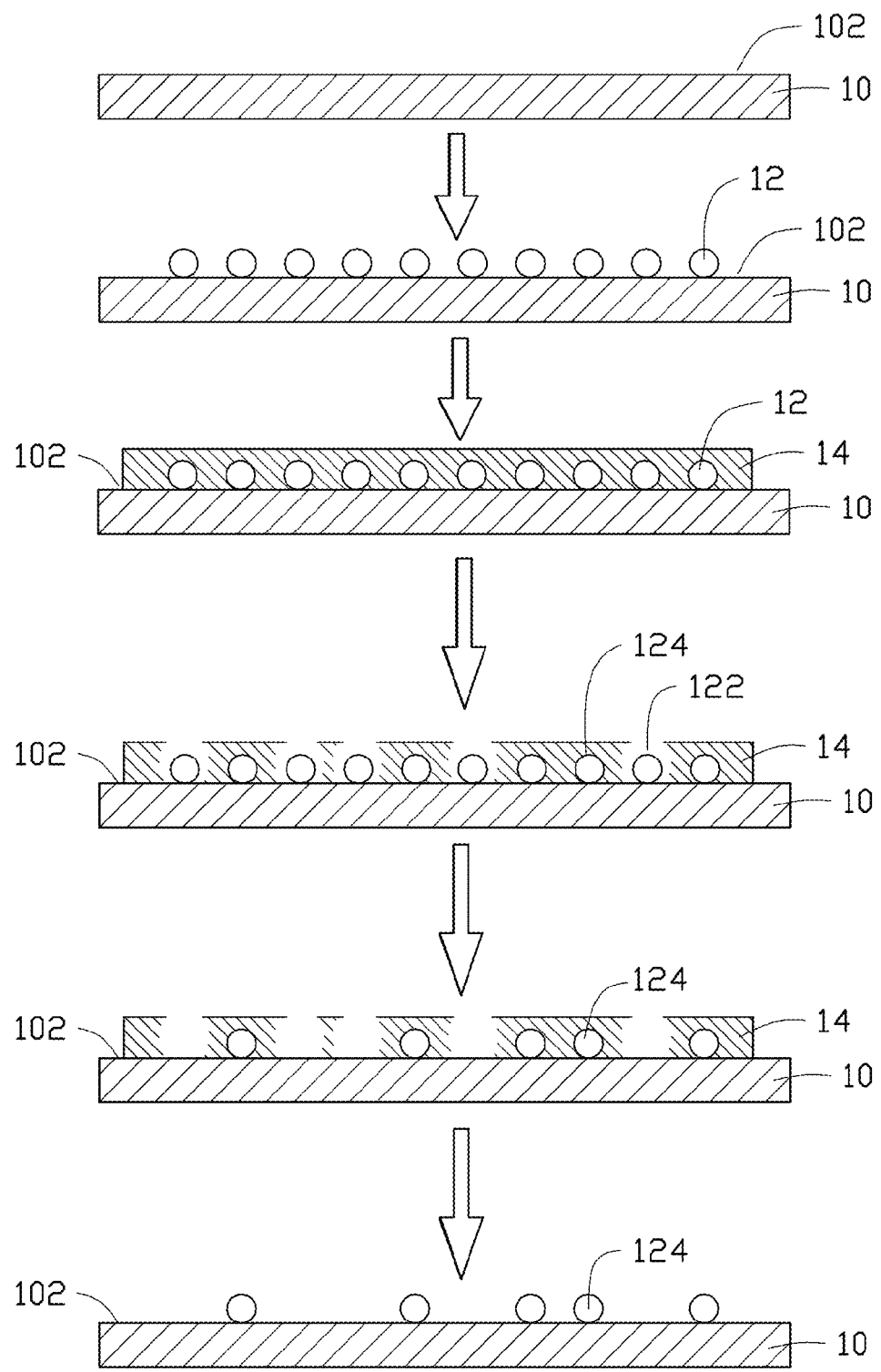
FIG. 1 is a schematic process flow of one embodiment of a method for making semiconducting SWCNTs.

Referring to FIG. 1, a method for making semiconducting SWCNTs of one embodiment includes steps of:

(S1), providing a substrate 10 having a first surface 102;

(S2), placing a single walled carbon nanotube film 12 on the first surface 102 of the substrate 10, wherein the single walled carbon nanotube film 12 includes a plurality of metallic SWCNTs 122 and a plurality of semiconducting SWCNTs 124;

(S3), applying a macromolecule material layer 14 on the single walled carbon nanotube film 12 to cover each of the plurality of metallic SWCNTs 122 and each of the semiconducting SWCNTs 124, wherein the macromolecule material layer 14, the single walled carbon nanotube film 12 and the substrate 10 form a compound;

(S4), exposing the plurality of metallic SWCNTs 122 by melting or decomposing the macromolecule material layer 14 in an environment filled with electromagnetic waves;

(S5), removing the plurality of metallic SWCNTs 122; and (S6), removing the macromolecule material layer 14 to obtain the plurality of semiconducting SWCNTs 124.

In the step (S1), the substrate 10 can be a substantially flat and smooth silicon substrate, such as a P-type silicon wafer, an N-type silicon wafer or a silicon wafer formed with an oxidized layer thereon. The substrate 10 can also be made of polymer or quartz. The substrate 10 has a high melting point, and the melting point of the substrate 10 can be greater than or equal to 600° C. In the first embodiment, a P-type silicon wafer is used as the substrate 10.

In the step (S2), the single walled carbon nanotube film 12 includes a plurality of SWCNTs including a plurality of metallic SWCNTs 122 and a plurality of semiconducting SWCNTs 124. A positional relationship of the metallic SWCNTs 122 and the semiconducting SWCNTs 124 is arbitrary. The plurality of SWCNTs is parallel to a surface of the single walled carbon nanotube film 12 and the first surface 102 of the substrate 10. In the single walled carbon nanotube film 12, two adjacent SWCNTs are not in contact with each other, to prevent a heat of the metallic SWCNTs 122 from burning out adjacent semiconducting SWCNTs 124. A distance between two adjacent SWCNTs can be greater than or equal to 10 nanometers. The plurality of SWCNTs can have the same length and be parallel to each other. The plurality of SWCNTs can have different lengths and not be parallel to each other. In one embodiment, the plurality of SWCNTs has the same length and is parallel to each other, the distance between two adjacent SWCNTs is 500 nanometers. A thickness of the single walled carbon nanotube film 12 can be in a range from about 0.5 nanometers to about 10 nanometers. In one embodiment, the thickness of the single walled carbon nanotube film 12 is in a range from about 0.5 nanometers to about 5 nanometers.

Figure 2:
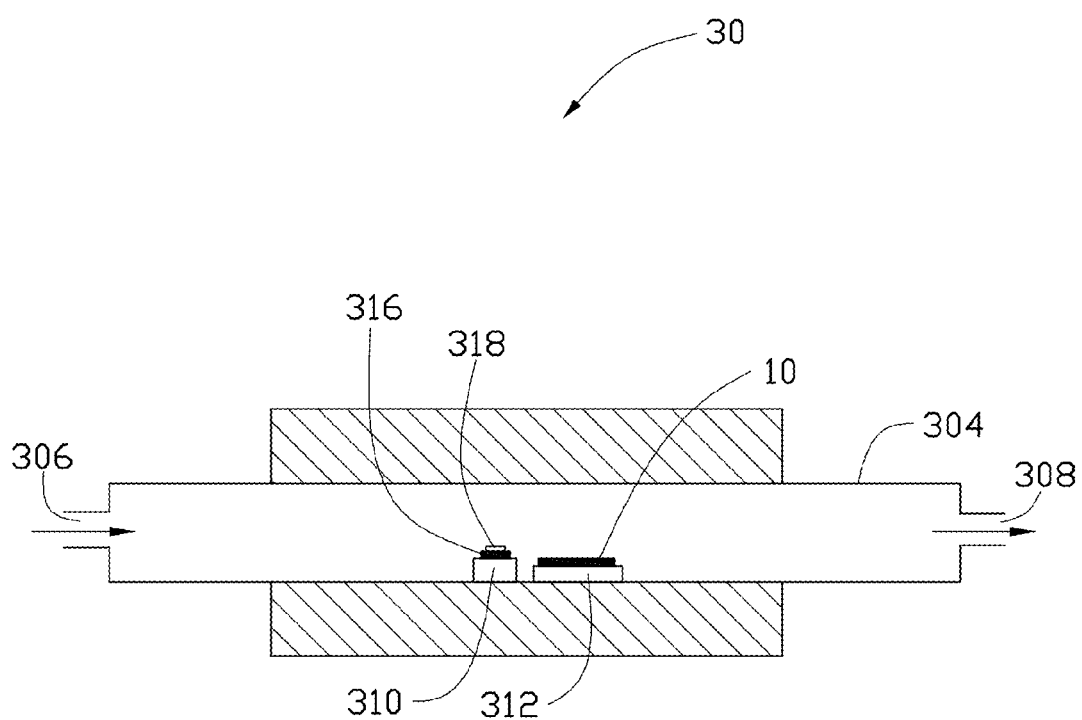
FIG. 2 is an illustration of a growing device for making a single walled carbon nanotube film.

Referring to FIG. 2, a method for making the single walled carbon nanotube film 12 of one embodiment includes steps of:

(S21), providing a growing device 30 including a fixing supporter 310 and a rotatable supporter 312;

(S22), providing a growing substrate 316 and the substrate 10, wherein a catalyst layer 318 is formed on a surface of the growing substrate 316;

(S23), placing the growing substrate 316 on the fixing supporter 310, and placing the substrate 10 on the rotatable supporter 312;

(S24), introducing a carbonaceous gas to grow a plurality of SWCNTs along a gas flow direction;

(S25), stopping introducing the carbonaceous gas, the plurality of SWCNTs formed on the first surface 102 of the substrate 10 is parallel to each other; and (S26), changing the growing substrate 316, and the single walled carbon nanotube film 12 is formed on the first surface 102 of the substrate 10.

In the step (S21), the reacting room 304 has a gas inlet 306 and a gas outlet 308. A rotatable supporter 312 disposes in the reacting room 304. A fixing supporter 310 disposed in the reacting room 304 is closer to the gas inlet 306 than the rotatable supporter 312. A distance between the rotatable supporter 312 and the fixing supporter 310 is less than 1 micrometer. The rotatable supporter 312 is lower than the fixing supporter 310. The rotatable supporter 312 can rotate in the horizontal plane arbitrarily.

In the step (S22), the catalyst layer 318 includes a layer of monodisperse catalyst. The method of forming the catalyst layer 318 depends on the material of the monodisperse catalyst.

While the catalyst is made of iron (Fe), cobalt (Co), nickel (Ni), or any alloy thereof, the process of forming the catalyst layer 318 on the growing substrate 316 includes the following substeps of: (a1) depositing a layer of monodisperse catalyst on the growing substrate 316; (a2) patterning the layer of monodisperse catalyst to form a catalyst layer 318 which is patterned. The method of depositing the catalyst layer 318 is selected from the group comprising of physical vapor deposition, chemical vapor deposition, coating and plating. The thickness of the catalyst layer 318 approximately ranges from 1 nanometer to 3 nanometers. Due to the thickness of the catalyst layer 318 being small, the catalyst materials in the catalyst layer 318 forms a plurality of monodisperse catalyst particles.

If the catalyst layer 318 is made of monodisperse solution of metal or metal-salt, the process of forming the catalyst layer 318 on the growing substrate 316 includes the following substeps of: (a1') applying a monodisperse solution onto the surface of the growing substrate 316 to form a layer of monodisperse solution; (a2') drying the monodisperse solution layer to form a catalyst layer 318. The step (a1') can be replaced by dipping the growing substrate 316 into the monodisperse solution. It could avoid the catalyst materials to gather together by using monodisperse solution to form the catalyst layer 318. Therefore, the catalyst layer 318 includes a plurality of monodisperse catalyst particles. The monodisperse solution of metal-salt can be selected from the group comprising a solution of $Fe(NO_3)_3$ and water, solution of $CuCl_2$ and water, solution of $FeCl_3$ and water, solution of $Fe(NO_3)_3$ and ethanol, solution of $CuCl_2$ and ethanol, and solution of $FeCl_3$ and ethanol. The monodisperse solution of metal is selected from the group comprising a solution of Fe—Mo and n-octane, solution of Fe—Co and n-octane, solution of Fe—Ru and n-octane, solution of Fe—Mo and hexane, solution of Fe—Co and hexane, solution of Fe—Ru and hexane, solution of Fe—Mo and ethanol, solution Fe—Co and ethanol, and solution of Fe—Ru and ethanol. In one embodiment, the catalyst layer 318 is formed by a solution of $Fe(NO_3)_3$ and ethanol.

In the step (S23), while placing the growing substrate 316 on the fixing supporter 310, it is necessary to make sure the catalyst layer 318 faces up. The growing substrate 316 and the substrate 10 are made of high melting materials. The melting point of the growing substrate 316 and the substrate 10 is above the growing temperature of the single walled carbon nanotube film. The shape and area of the growing substrate 316 and the substrate 10 is arbitrary.

The growing substrate 316 can be a rectangle. In one embodiment, the growing substrate 316 is a silicon strip. The length of the growing substrate 316 is 10 centimeters and the width of the growing substrate 316 is 1 millimeter. The growing substrate 316 can be made by the steps of forming a catalyst layer 318 on a large wafer, and then cutting the large wafer into a number of silicon strips of predetermined size. The substrate 10 can be a square. The length of side of the substrate 10 approximately ranges from 1 centimeter to 10 centimeters. Also, the substrate 10 can be a network, such as copper wire mesh. In one embodiment, the substrate 10 is a 4-inch wafer.

The step (24) includes the following substeps of: (b1) introducing a protective gas into the reacting room 304 to evacuate the air in the reacting room 304; (b2) heating the reacting room 304 up to growing temperature of the SWCNTs; and (b3) introducing a carbonaceous gas to grow the SWCNTs.

In the step (b1), the protective gas is selected from the group comprising of nitrogen ($N_2$) gas and noble gas. In one embodiment, the protective gas is argon (Ar) gas.

In the step (b2), the growing temperature of the SWCNTs ranges approximately from 800 degrees to 1000 degrees. It is to be understood that the growing temperature varies with the carbonaceous gas. In one embodiment, the carbonaceous gas is ethanol, so the growing temperature of the SWCNTs ranges approximately from 850 degrees to 950 degrees. If the carbonaceous gas were methane, the growing temperature of the SWCNTs would range approximately from 950 degrees to 1000 degrees.

In the step (b3), the carbonaceous gas is hydrocarbon with active chemical properties. The carbonaceous gas can be selected from the group comprising of ethanol, ethane, methane, and combinations thereof. In one embodiment, the carbonaceous gas is ethanol or methane. The flux of the carbonaceous gas ranges approximately from 5 to 100 milliliter per minute. An additional carrier gas such as hydrogen, can be also introduced into the reacting room 304 with the carbonaceous gas. The flux ratio of the carbonaceous gas and the carrier gas ranges approximately from 1:1 to 1:3.

After introducing the carbonaceous gas into the reacting room 304, it starts to grow carbon nanotubes under the effect of the catalyst. One end (i.e., the root) of the carbon nanotubes is fixed on the growing substrate 316, and the other end (i.e., the top/free end) of the carbon nanotubes grow continuously. The density of the carbon nanotubes is low due to the catalyst layer 318 including a plurality of monodisperse catalyst grain. Therefore, a part of the carbon nanotubes grow into SWCNTs. Because the fixing supporter 310 disposed in the reacting room 304 is near the gas inlet 306, the SWCNTs float above the substrate 10 with the roots of the SWCNTs still sticking on the growing substrate 316, as the carbonaceous gas is continuously introduced into the reacting room 304. The mechanism of growing SWCNTs is called "kite-mechanism." The length of the SWCNTs depends on the growing time. In one embodiment, the growing time approximately ranges from 10 minutes to 30 minutes. The length of the SWCNTs approximately ranges from 1 centimeter to 30 centimeters.

In the step (S25), after cutting off the supply of the carbonaceous gas into the reacting room 304, the SWCNTs stop growing and land on the substrate 10. The SWCNTs fall down onto the substrate 10 parallel and separately due to the gravity and are allowed to cool. In order to avoid oxidation of the SWCNTs, the protective gas should be continuously fed into the reacting room 304 until the temperature of the reacting room 304 is cooled down to room temperature. Furthermore, the single walled carbon nanotube film 12 is cut off from the growing substrate 316.

In the step (S26), changing the growing substrate 316 can be carried out by providing a new one of the growing substrate 316 with the catalyst layer 318 or recycling the original growing substrate 316. The original growing substrate 316 is recycled by cleaning the original growing substrate 316 and forming a new catalyst layer 318 thereon. More SWCNTs can fall on to the first surface 102 of the substrate 10 to form the single walled carbon nanotube film 12 by repeating steps (S24) and (S25) as often as desired.

Figure 3:
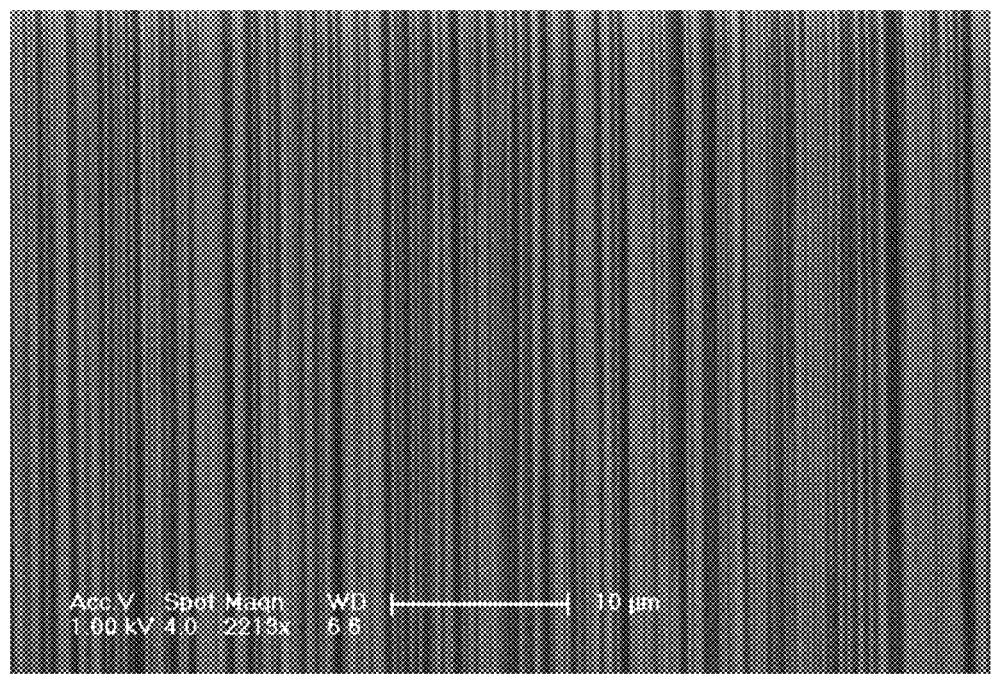
FIG. 3 shows a scanning electron microscope image of the single walled carbon nanotube film manufactured by the growing device of FIG. 2.

Referring to FIG. 3, the single walled carbon nanotube film 12 has a plurality of SWCNTs parallel to each other. The plurality of SWCNTs has the same length of 100 micrometers, the distance between two adjacent SWCNTs is 500 nanometers. The SWCNTs in the single walled carbon nanotube film 12 connect to each other by van der Waals attractive force therebetween, thus, the single walled carbon nanotube film 12 is a free-standing structure.

The term "free-standing" includes, but not limited to, the single walled carbon nanotube film 12 that does not have to be supported by a substrate. For example, the single walled carbon nanotube film 12 which is free-standing can sustain the weight of itself when it is hoisted by a portion thereof without any significant damage to its structural integrity. So, if the single walled carbon nanotube film 12 which is free-standing is placed between two separate supporters, a portion of the free-standing single walled carbon nanotube film 12, not in contact with the two supporters, would be suspended between the two supporters and yet maintain film structural integrity.

Figure 4:
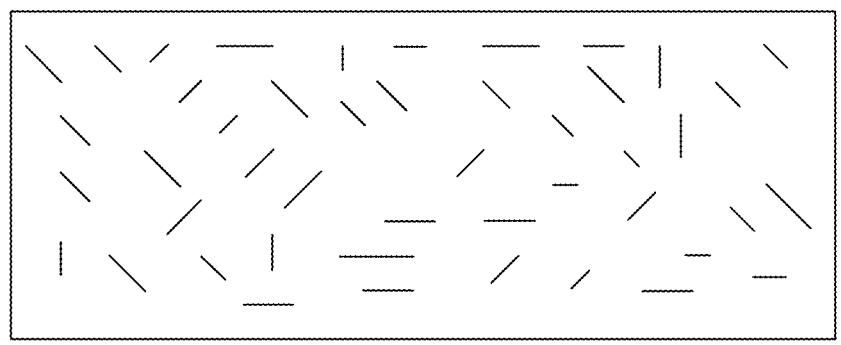
FIG. 4 is a schematic view of another embodiment of the single walled carbon nanotube film according to FIG. 1.

It is understood, the single walled carbon nanotube film 12 can be formed by coating a solution of SWCNTs on the first surface 102 of the substrate 10. At the same time, the SWCNTs can have different lengths and not be parallel to each other. It is necessary to make sure two adjacent SWCNTs are not in contact with each other, as shown in FIG. 4.

In the step (S3), the macromolecule material layer 14 can enclose each of the plurality of metallic SWCNTs and each of the plurality of semiconducting SWCNTs. The space between each two adjacent SWCNTs of the plurality of SWCNTs is filled with material of the macromolecule material layer 14. The macromolecule material layer 14 is formed by coating a macromolecule solution or molten macromolecule material. The macromolecule solution is formed by dissolving a macromolecule material into an organic solvent. The organic solvent can be ethanol, methanol, acetone, or chloroform. The molten macromolecule material is formed by heating the macromolecule material to a molten temperature of the macromolecule material. The macromolecule solution or the molten macromolecule material can have a viscosity greater than 1 Pa·s. A melting point of the macromolecule material can be lower than or equal to 600° C., or a decomposing temperature of the macromolecule material can be lower than or equal to 600° C. In one embodiment, the melting point of the macromolecule material is lower than or equal to 300° C., or a decomposing temperature of the macromolecule material is lower than or equal to 300° C. The macromolecule material can be phenolic resin (PF), polystyrene (PS), ethoxyline resin (EP), polyurethane (PU), polymethyl methacrylate. (PMMA), polycarbonate (PC), polyethylene terephthalate (PET), or polyalkenamer.

The macromolecule solution or the molten macromolecule material can be uniformly coated on the surface of the single walled carbon nanotube film 12 by a spraying method, or a spin coating method. The surface of the single walled carbon nanotube film 12 away from the substrate 10 can be immersed in the macromolecule solution. It is necessary to make sure the macromolecule material layer 14 cover each of the plurality of SWCNTs. A thickness of the macromolecule material layer 14 is related to the distance between two adjacent SWCNTs. The thickness of the macromolecule material layer 14 can be in a range from about 0.1 micrometers to about 1 millimeter. In one embodiment, the macromolecule material is PMMA, and the organic solvent is methyl-phenoxide.

In the step (S4), the macromolecule material layer 14 barely absorbs electromagnetic wave energy. A heat capacity per unit area of the macromolecule material layer 14 is greater than the heat capacity per unit area of the single walled carbon nanotube film 12. The semiconducting SWCNTs 124 barely absorb the electromagnetic wave energy, but the metallic SWCNTs 122 can absorb the electromagnetic wave energy and generate heat. That is, a speed of absorbing the electromagnetic wave energy of the metallic SWCNTs 122 is faster than the speed of absorbing the electromagnetic wave energy of the semiconducting SWCNTs 124. Thus, after absorbing the electromagnetic wave energy, a temperature of the metallic SWCNTs 122 rises quickly. This temperature increase will heat the portions of the macromolecule material layer 14 covering the metallic SWCNTs 122 until the macromolecule material layer 14 is melted or decomposed. The metallic SWCNTs 122 are exposed because the portions of the macromolecule material layer 14 covering the metallic SWCNTs 122 is melted or decomposed.

At the same time, the heat generated by the metallic SWCNTs 122 can be absorbed by the macromolecule material layer 14 and the substrate 10. Thus, the temperature of the single walled carbon nanotube film 12 can be controlled to be under 700° C., and the single walled carbon nanotube film 12 will not burn.

The semiconducting SWCNTs 124 barely absorbs the electromagnetic wave energy, so the temperature of the portion of the macromolecule material layer 14 covering the semiconducting SWCNTs 124 dose not rise. The portions of the macromolecule material layer 14 covering the semiconducting SWCNTs 124 are not melted or decomposed. Thus, the semiconducting SWCNTs 124 are still covered by the macromolecule material layer 14.

In one embodiment, the thickness of the macromolecule material layer 14 is less than the distance between two adjacent SWCNTs, in order to expose the metallic SWCNTs 122 but not burn out their adjacent semiconducting SWCNTs 124. In one embodiment, the thickness of the macromolecule material layer 14 is in a range from about 10 nanometers to about 500 nanometers, the temperature of the portions of the macromolecule material layer 14 covering the metallic SWCNTs 122 is raised to 300 degrees.

A power of the electromagnetic waves can be in a range from about 300 watts to about 2000 watts. A frequency of the electromagnetic waves can be in a range from about 0.3 gigahertz to about $1 \times 10^6$ gigahertz. The electromagnetic waves can be radio frequency, microwaves, near infrared, or far infrared. In one embodiment, the electromagnetic waves are microwaves. A power of the microwaves can be in a range from about 300 watts to about 1500 watts. A frequency of the microwaves can be in a range from about 0.3 gigahertz to about 300 gigahertz. The compound is kept in a chamber filled with the microwaves from about 1 second to about 600 seconds. In other embodiments, the compound is kept in the chamber filled with the microwaves from about 3 seconds to about 90 seconds. The time period the compound is kept in the chamber filled with the microwaves depends on the macromolecule material layer 14 and the power of the microwaves. The higher the power of the microwaves, the shorter the time the chamber needs to be filled with the microwaves. In one embodiment, the time is about 30 seconds.

The step (S4) can be carried out in a vacuum environment or in a specific atmosphere of protective gases such as nitrogen gas or inert gases. A gas pressure of the environment is in a range from about $1 \times 10^{-2}$ Pascals to about $1 \times 10^{-6}$ Pascals. The single walled carbon nanotube film 12 can reach the temperature of about 900 degrees in the vacuum environment or in the specific atmosphere of protective gases.

In the step (S5), the metallic SWCNTs 122 can be removed by a reactive ion etching (RIE) method. A method of the RIE of one embodiment includes steps of:

(S51), disposing the macromolecule material layer 14, the single walled carbon nanotube film 12 and the substrate 10 in a reactive ion etching vacuum chamber;

(S52), introducing reactive gas into the reactive ion etching vacuum chamber; and (S53), etching away the metallic SWCNTs 122 by reactive ions generated by glow discharge of the reactive gas.

In the step (S52), the reactive gas can be oxygen, hydrogen, argon, ammonia, or $CF_4$. In one embodiment, the reactive gas is oxygen gas.

In the step (S53), during the etching process, the reactive ions etch away the metallic SWCNTs 122. A power of the RIE system can be in a range from about 20 watts to about 300 watts. A flow rate of the reactive gas can be in a range from about 10 sccm to about 100 sccm. An etching period can be in a range from about 5 seconds to about 10 minutes. In one embodiment, the power of the RIE system is about 30 watts, the flow rate of the reactive gas is about 50 sccm, and the etching period is in a range from about 15 seconds to about 1 minute.

In the step (S6), the macromolecule material layer 14 can be removed by a chemical reagent. The chemical reagent can be tetrahydrofuran, dichloroethane, chloroform, acetone, glacial acetic acid, dioxane, tetrahydrofuran, acetic ether, or toluene. In one embodiment, the macromolecule material layer 14 is immersed into the acetone to remove the macromolecule material layer 14, wherein the macromolecule material layer 14 is made of PMMA. Furthermore, the semiconducting SWCNTs 124 located on the first surface 102 of the substrate 10 can be taken out from the chemical reagent and dried.

Figure 5:
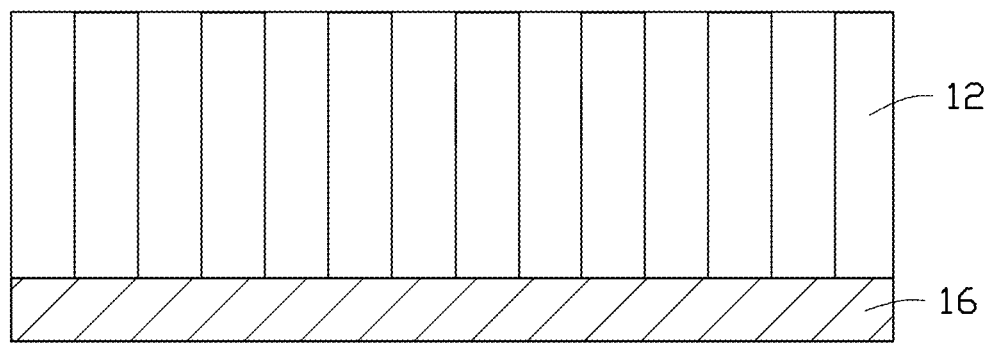
FIG. 5 is a schematic view of one embodiment of an electrode located on one side of the single walled carbon nanotube film of FIG. 2.

Referring to FIGS. 1 and 5, a method for making semiconducting SWCNTs of another embodiment includes steps of:

(S1), providing a substrate 10 having a first surface 102;

(S2), placing a single walled carbon nanotube film 12 on the first surface 102 of the substrate 10, wherein the single walled carbon nanotube film 12 includes a plurality of metallic SWCNTs 122 and a plurality of semiconducting SWCNTs 124;

(S3), applying at least one electrode 16 on one side of the single walled carbon nanotube film 12 and electrically connecting with the single walled carbon nanotube film 12;

(S4), forming a macromolecule material layer 14 on the single walled carbon nanotube film 12 to cover each of the plurality of metallic SWCNTs 122 and each of the semiconducting SWCNTs 124;

(S5), exposing the plurality of metallic SWCNTs 122 by bombarding the macromolecule material layer 14 with an electron beam;

(S6), removing the plurality of metallic SWCNTs 122; and (S7), removing the macromolecule material layer 14 to obtain the plurality of semiconducting SWCNTs 124.

The step (S1) where the melting point of the substrate 10 can be arbitrary.

In step (S2), two adjacent SWCNTs of the single walled carbon nanotube film 12 can be in contact with each other or be spaced from each other. The plurality of SWCNTs of the single walled carbon nanotube film 12 has the same length and be parallel to each other.

In the step (S3), the at least one electrode 16 can be located on one side of the single walled carbon nanotube film 12. In one embodiment, two of the electrodes 16 are located on opposite two sides of the single walled carbon nanotube film 12. The at least one electrode 16 is electrically connected to one end or two ends of the plurality of SWCNTs.

The electrode 16 can be made of conductive material, such as metal, conductive polymer, conductive adhesive, metallic carbon nanotubes, or indium tin oxide. The shape and structure of the electrode 16 is arbitrary. The electrodes 16 can be made by a method such as screen printing, chemical vapor deposition, or magnetron sputtering. In one embodiment, the electrode 16 is formed concurrently by printing conductive silver paste. The conductive silver paste can include about 50% to about 90% (by weight) of the metal powder, about 2% to about 10% (by weight) of the glass powder, and about 8% to about 40% (by weight) of the binder.

In the step (S4), the melting point of the macromolecule material layer 14 can be arbitrary. The macromolecule material layer 14 can be penetrated by a high-energy electron beam.

In the step (S5), an electron beam source is located above the macromolecule material layer 14, and an electric field is supplied between the electron beam source and the macromolecule material layer 14. The electron beam source can emit the high-energy electron beam including a plurality of electrons.

During the bombarding process, when the plurality of electrons from the electron beam source reaches to the semiconducting SWCNTs 124, firstly the semiconducting SWCNTs 124 will collect and gather the plurality of electrons. The plurality of electrons collected and gathered by the semiconducting SWCNTs 124 can form a protective layer to protect the semiconducting SWCNTs 124. Then when some electrons form the electron beam source continue to reach to the semiconducting SWCNTs 124, the electrons will be reflected by the protective layer to the metallic SWCNTs 122.

When the electrons from the electron beam source and reflected by the protective layer reach to the metallic SWCNTs 122, the electrons will be transmitted to the electrode 16 along an axial direction of each of the metallic SWCNTs 122 in the electric field. In the process of transmitting the electrons along the axial direction of each of the metallic SWCNTs 122 in the electric field, the portions of the macromolecule material layer 14 covering the metallic SWCNTs 122 will be etched, and the metallic SWCNTs 122 will be exposed. The semiconducting SWCNTs 124 are still covered by the macromolecule material layer 14.

Energy of the high-energy electron beam from the electron beam source can be in a range from about 200 electron volts (eV) to about 200 kiloelectron volts (KeV). Electron beam bombarding time can be in a range from about 5 seconds to about 10 minutes. In one embodiment, the energy of the high-energy electron beam is in a range from about 500 eV to about 100 KeV, and the electron beam bombarding time is in a range from about 30 seconds to about 5 minutes.

In summary, in the process of making the semiconducting SWCNTs 124 by above-described methods, the metallic SWCNTs 122 can be completely removed, and the semiconducting SWCNTs 124 are not destroyed. Thus, the semiconducting SWCNTs 124 have high purity. Moreover, the method for making the semiconducting SWCNTs 124 is simple and can be mass produced in a large quantity.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A semiconducting single walled carbon nanotubes (SWCNTs) making method comprising:
    placing a single walled carbon nanotube film on a first surface of a substrate, wherein the single walled carbon nanotube film comprises a plurality of SWCNTs comprising metallic SWCNTs and semiconducting SWCNTs;
    electrically connecting an electrode with the single walled carbon nanotube film;
    applying a macromolecule material layer on the single walled carbon nanotube film to cover the single walled carbon nanotube film;
    exposing the metallic SWCNTs by bombarding the macromolecule material layer with an electron beam;
    removing the metallic SWCNTs; and
    removing the macromolecule material layer.

2. The semiconducting SWCNTs making method of claim 1, wherein adjacent SWCNTs of the plurality of SWCNTs are not in contact with each other, and a distance between the adjacent SWCNTs is greater than or equal to 10 nanometers.

3. The semiconducting SWCNTs making method of claim 1, wherein adjacent SWCNTs of the plurality of SWCNTs are in contact with each other.

4. The semiconducting SWCNTs making method of claim 1, wherein the plurality of SWCNTs has a same length and is parallelly spaced from each other.

5. The semiconducting SWCNTs making method of claim 1, wherein the single walled carbon nanotube film is a free-standing structure.

6. The semiconducting SWCNTs making method of claim 1, wherein the plurality of SWCNTs is parallel to a surface of the single walled carbon nanotube film and the first surface of the substrate.

7. The semiconducting SWCNTs making method of claim 1, wherein the electrically connecting the electrode with the single walled carbon nanotube film comprises contacting the electrode with one side of the single walled carbon nanotube film.

8. The semiconducting SWCNTs making method of claim 1, wherein the electrically connecting the electrode with the single walled carbon nanotube film comprises contacting a first electrode with a first side of the single walled carbon nanotube film and contacting a second electrode with a second side of the single walled carbon nanotube film opposite to the first side.

9. The semiconducting SWCNTs making method of claim 1, wherein the electrically connecting the electrode with the single walled carbon nanotube film comprises electrically connecting a first electrode to a first end of each of the plurality of SWCNTs and connecting a second electrode to a second end of each of the plurality of SWCNTs opposite to the first end.

10. The semiconducting SWCNTs making method of claim 1, wherein a thickness of the macromolecule material layer is in a range from about 0.1 micrometers to about 1 millimeter.

11. The semiconducting SWCNTs making method of claim 1, wherein the applying the macromolecule material layer on the single walled carbon nanotube film comprises coating a macromolecule solution or molten macromolecule material.

12. The semiconducting SWCNTs making method of claim 11, wherein the macromolecule material is penetrated by the electron beam.

13. The semiconducting SWCNTs making method of claim 12, wherein energy of the electron beam is in a range from about 200 electron volts to about 200 kiloelectron volts.

14. The semiconducting SWCNTs making method of claim 1, wherein the macromolecule material layer encloses each of the metallic SWCNTs and each of the semiconducting SWCNTs.

15. The semiconducting SWCNTs making method of claim 1, wherein spaces between adjacent SWCNTs of the plurality of SWCNTs are filled with material of the macromolecule material layer.

16. The semiconducting SWCNTs making method of claim 1, wherein the removing the metallic SWCNTs comprises steps of:
    disposing the treated compound in a reactive ion etching vacuum chamber;
    introducing reactive gas into the reactive ion etching vacuum chamber; and
    etching away the metallic SWCNTs by reactive ions generated by glow discharge of the reactive gas.

17. The semiconducting SWCNTs making method of claim 1, wherein the removing the macromolecule material layer comprises treating the macromolecule material layer by a chemical reagent.

18. A semiconducting single walled carbon nanotubes (SWCNTs) making method comprising:
    placing a single walled carbon nanotube film on a first surface of a substrate, wherein the single walled carbon nanotube film comprises a plurality of SWCNTs comprising metallic SWCNTs and semiconducting SWCNTs, wherein the plurality of SWCNTs is parallel to each other;
    electrically connecting an electrode with the single walled carbon nanotube film;
    applying a macromolecule material layer on the single walled carbon nanotube film to enclose each of the metallic SWCNTs and each of the semiconducting SWCNTs;
    exposing the metallic SWCNTs by bombarding the macromolecule material layer with an electron beam;
    etching away the metallic SWCNTs; and
    removing the macromolecule material layer.

19. The semiconducting SWCNTs making method of claim 18, wherein a distance between adjacent SWCNTs of the plurality of SWCNTs is greater than or equal to 10 nanometers.

20. The semiconducting SWCNTs making method of claim 18, wherein spaces between adjacent SWCNTs of the plurality of SWCNTs are filled with material of the macromolecule material layer.

* * * * *